United States Patent [19]

Narken et al.

[11] 4,221,047
[45] Sep. 9, 1980

[54] MULTILAYERED GLASS-CERAMIC SUBSTRATE FOR MOUNTING OF SEMICONDUCTOR DEVICE

[75] Inventors: Bernt Narken, Poughkeepsie; Rao R. Tummala, Wappingers Falls, both of N.Y.

[73] Assignee: International Business Machines Corporation, Armonk, N.Y.

[21] Appl. No.: 23,113

[22] Filed: Mar. 23, 1979

[51] Int. Cl.³ .................. H05K 3/10; H05K 3/38; H05K 3/46
[52] U.S. Cl. ............................. 29/840; 29/848; 65/33; 65/60 A; 65/60 C
[58] Field of Search ............... 65/33, 18, 60 A, 60 C; 264/61; 427/89, 125; 29/626, 625

[56] References Cited

U.S. PATENT DOCUMENTS

| | | | |
|---|---|---|---|
| 3,040,213 | 6/1962 | Byer et al. ........................... 65/33 X |
| 3,113,009 | 12/1963 | Brown et al. ........................... 65/33 |
| 3,560,256 | 2/1971 | Abrams ................................. 29/625 X |
| 3,604,082 | 9/1971 | McBrayer et al. ................... 65/33 X |
| 3,726,002 | 4/1973 | Greenstein et al. ............. 65/60 A X |
| 3,774,232 | 11/1973 | May ................................... 29/625 X |
| 3,864,159 | 2/1975 | Field et al. ............................. 427/79 |
| 3,956,052 | 5/1976 | Koste ................................. 427/123 X |
| 3,968,193 | 7/1976 | Langston, Jr. et al. ................ 264/61 |
| 3,988,405 | 10/1976 | Smith et al. ........................... 65/18 X |
| 4,009,238 | 2/1977 | Niedermeier et al. .................. 264/61 |
| 4,030,190 | 6/1977 | Varker ................................... 29/625 |
| 4,068,022 | 1/1978 | Glick ..................................... 427/125 |
| 4,098,949 | 7/1978 | Kosiorek ........................... 427/125 X |
| 4,104,345 | 8/1978 | Anderson et al. .................. 264/61 X |
| 4,109,377 | 8/1978 | Blazick et al. ..................... 264/61 X |

Primary Examiner—Richard V. Fisher
Attorney, Agent, or Firm—Henry Powers

[57] ABSTRACT

A method for fabricating an interconnection package for a plurality of semiconductor chips which include the fabrication of a multi-layered glass-ceramic superstructure with a multi-layered distribution of conductors on a preformed multi-layered glass-ceramic base, by the repeatable steps of depositing a conductor pattern on the base and forming thereon a crystallizable glass dielectric layer which is then crystallized to a glass-ceramic prior to further additions of conductor patterns and crystallizable glass layers to form a monolithic compatible substrate all through. Semiconductor chips can be electrically connected to expose conductor patterns at the top surface of the resultant glass-ceramic package.

13 Claims, 7 Drawing Figures

MULTILAYERED GLASS-CERAMIC SUBSTRATE FOR MOUNTING OF SEMICONDUCTOR DEVICE

DESCRIPTION

TECHNICAL FIELD

This invention relates to semiconductor packages and more particularly to a multi-layer glass-ceramic metal package preferably compatible for integral mounting of semiconductor devices.

One object of the present invention is to provide an improved multilayered support for interconnection to semiconductor devices.

Another object of this invention is to provide electrical interconnection for a plurality of integrated circuit semiconductor chips through a glass-ceramic carrier having a multilayered distribution of interconnected thick and thin film metallization pattern.

Another object of this invention is to provide a bubble-free glass-ceramic and metal interconnection package which can be fabricated at temperatures which avoid distortion of underlying metallized patterns and vertical interconnecting studs.

Another object of this invention is to provide means for fabricating on a pre-formed glass-ceramic substrate containing a multilayered distribution of thick films copper conductive patterns, an integrated multilayered distribution of thin film copper metallurgy interleaved with layers of glass-ceramic layers, each of which has been individually formed without distortion of prior formed metallurgy and glass-ceramic layers below the melting point of copper.

BRIEF DESCRIPTION OF THE PRIOR ART

As the integrated circuit technology advances towards large scale integration in high performance circuits, it is necessary to provide interconnection electrical packaging which is compatible with the performance demands of the associated circuitry. Thus, the problems of signal delay, package impedance, and cross talk are extremely critical. Known prior art packaging materials often do not possess appropriate controllable dielectric properties to accomodate high performance circuits in large scale integration schemes.

A high quality glass-metal package offers one solution to the problem. By simply changing the specific glass composition, the various desired range of properties are readily controllable and selectable. It has relatively high strength, and its chemically inert and thermally stable properties are extremely adaptable for known upper surface chip bonding techniques.

Despite the desirability of employing glass as the dielectric insulating layer in multilayer interconnection packages, known processes for fabricating a multi-level package are almost non-existent or result in such poor quality products that the advantages attributable to certain dielectric properties of the selected glass are defeated.

Generally, one basic problem in forming multi-level glass layers is traced to the formation of bubbles occurring during the firing step. One type of bubble results from the decomposition of organic materials present on the surface upon which the glass layer is being deposited. This decomposition causes evolution of gases that are trapped or absorbed by the upper glass layer. The consequence of this type of bubble formation is to create voids in the glass structure. During subsequent metal evaporation steps, these voids or openings often cause electrical shorting due to metallization forming in the voids or openings. Also, the voids trap extraneous material so as to further aggravate the contamination problem. Even if the bubble remains intact or does not break in the glass, its presence often destroys the planarity of the upper glass surface so as to impair subsequent processing operations, such as the photolithographic steps, particularly with extremely fine lines as will be described later.

A second type of bubble or closed cell structure also creates problems in the formation of multi-layer glass modules. The gaseous ambient surrounding the glass during the firing step forms bubbles in the glass layer. A closed cell or bubble is formed as the glass layer enters the sintering phase. Sintering is that point at which the solid glass particles start to soften under the exposure to heat, and begin to join or coalesce with adjacent particles. At the sintering temperature, the glass is not capable of reflowing into a homogeneous body without the formation of bubbles.

As adjacent solid glass particles (having random geometrical shapes) begin to join, a closed cavity is formed. Stated in another way, necks are grown between two adjacent glass particles, and then the necks continue to grow between other pairs of particles, and thus ultimately, between all particles. At this point, an interconnected network of sintered glass particles are formed with enclosed voids throughout the network. The existence of this network prevents the fabrication of high quality multi-layer glass-metal modules having the desired impedance and planarity characteristics.

The prior art in the general glass area has suggested that bubble-free glass layers can be formed by outdiffusing the bubbles at a very high temperature. Often, this outdiffusion occurs in different gaseous ambients. However, this approach is totally unsuitable for the present multi-layer glass-metal modules, because the relatively high temperatures required to outwardly diffuse the trapped bubbles in the glass layer would completely destroy and disrupt previously deposited metallization lines and vertical metallic interconnection studs existing within the glass body, as well as underlying glass layers.

A high quality bubble-free structure is also theoretically achievable by firing the glass in a complete vacuum. However, this approach causes a considerable number of practical problems, particularly in large scale manufacturing operations due to the unfeasibility of working in this ambient.

Sputtering of successive glass layers to form a multi-level glass-metal package is another possible approach. However, this technique gives rise to significant disadvantages from a process and structural standpoint. Firstly, the sputtering process does not lend itself to the practical fabrication of glass layers of any appreciable thickness, which are sometimes necessary in order to obtain the desired impedance characteristics for the particular package designed. Further, it is not workable to build up a plurality of glass layers having interposed metallization patterns, and yet maintain each of the individual metallization patterns in a single plane.

In U.S. Pat. Nos. 3,726,002 and 3,968,193, it has been proposed to form a high-quality and high performance multilayer substrate for interconnection to semiconductor devices, by fabricating a complex thin film interconnection package on a dissimilar refractory (e.g. alumina) substrate, by forming a plurality of bubble-free layers of glass over the substrate, depositing a plurality of thin film metallization patterns on each layer of deposited glass, selectively depositing vertical conductive studs for electrical interconnection between various conductive patterns, and bonding a plurality of integrated circuit chips to the upper surface of the glass package. Although this method has received acceptance in the technology, it nevertheless suffers from the disadvantage of requiring extreme care and attention in fabrication in order to avoid loss of integrity. It should be noted that alumina substrate, because of its high thermal expansion coefficient compared to silicon does not allow bonding of larger chips.

For example, as noted in the said patents, since the significant factor in working glass is its firing temperature it is necessary to take into close account the sintering temperatures of the glasses to avoid disruptions underlying metallization. Thus where like glasses are used, the sintering temperatures can soften the underlying glass layers resulting in viscous deformation thereof with danger of accompanying displacement of the metallization patterns.

Also present is the danger of glass cracking, which requires critical matching of the thermal coefficients of expansion between the multilayer glass component and the multilayered ceramic component which is coped with in the last said patents by providing a compromised relationship of stresses, e.g. where, in the resultant package, the glass-component is in a state of comparison whereas the underlying ceramic component is in a state of tension, a condition which detracts from the integrity of the package.

BRIEF DESCRIPTION OF THE DRAWINGS

In the accompanying drawings forming a material part of this disclosure.

DISCLOSURE OF THE INVENTION

Figure 1:
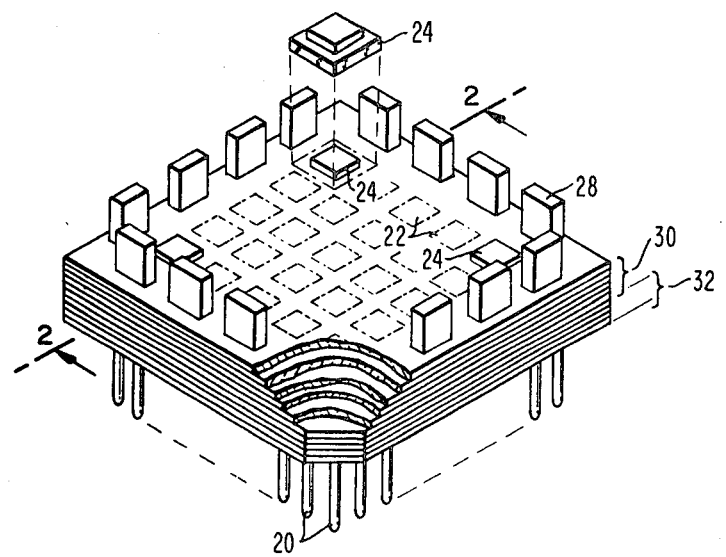
FIG. 1 illustrates a semiconductor integrated circuit package for interconnecting a plurality of semiconductor chips on a single substrate, and the perspective view is partially broken away to illustrate the manner in which the glass metal portion is constructed.

For further comprehension of the invention, and of the objects and advantages thereof, reference will be had to the following description and accompanying drawings, and to the appended claims in which the novel features of the invention are more particularly set forth.

The invention comprehended is the fabrication of a high-density high-performance logic and memory substrates of glass-ceramics utilizing in the lower network a thick film paste technology for ground and power planes and an upper network of thin film technology for redistribution and signal planes.

The term "thick films", as employed in this application are normally formed from a paste of metallic particles and a vehicle which can be selectively applied (e.g. by screening) onto a substrate which is subsequently fired to drive out the vehicle and unitize the metallic particles into the desired patterns of conductors. Typically, the thick films can be 10 mils or more, but may be as little as 0.5 mils after firing.

In thin-film circuits, the conductor networks or patterns are composed of thin metallic films of the order of 300 Å to 30,000 Å thick, preferably formed by a vacuum deposition technique, such as sputtering or evaporation. The thin films can be deposited through suitable masks to form the desired circuit pattern, or as blanket films which are then selectively etched to form the desired circuit pattern.

The invention utilizes a pre-formed multilayered glass-ceramic base having embedded therein a multiplanar distribution of thick film conductor patterns, preferably of gold, silver or copper as disclosed and described in copending U.S. applications Ser. No. 875,703 filed Feb. 2, 1978 by Kumar et al. and Ser. No. 023,112, filed Mar. 23, 1979, by Herron et al titled "Multilayered Glass-Ceramic Structure Having An Internal Distribution of Copper-Based Conductors".

Also, as used herein and in the claims, the term "alpha-cordierite glass-ceramic" is directed to (one) preferred glass-ceramic structure which is coalesced and crystallized from "alpha-cordierite glasses" to an article having a micro-structure of a pervasive network of 2 to 5 $\mu$m crystallites of small amounts of clinoenstatite and additional cordierite phase.

In addition, as used herein and in the claims, the term "$\beta$-spodumene glass-ceramic" is directed to another glass-ceramic structure coalesced and crystallized from "$\beta$-spodumene glasses" into an article having a microstructure of a pervasive continuous network of 2–5 $\mu$m crystallites of $\beta$-spodumene with the interstices of said network occupied by residual glass having dispersed therein discrete secondary 1 to 2 $\mu$m crystallites of lithium mitasilicate.

MULTILAYER SUBSTRATE FABRICATION

Specifically the pre-formed substrate utilizes crystallizable glasses of the $\beta$-spodumene type and the cordierite type to fabricate multilayer glass-ceramic substrates containing co-sintered conductor patterns of gold, silver or, preferably, copper. The substrate fabrication involves the following steps:

STEP 1

The cullet of the chosen glass is ground to average particle sizes in the range of 2 to 7 $\mu$m. The grinding can be done in two stages—a preliminary dry or wet grinding to —400 mesh particle size followed by further grinding with suitable organic binders and solvents until the average particle size is reduced to lie between 2 to 7 $\mu$m and a castable slurry or slip is obtained. A single stage prolonged grinding of cullet in the medium of the binder and solvent, until the desired particle size is obtained, can also be used. In the latter case, a filtering step may be needed to remove oversized particles. By way of example, a suitable binder is poly-vinyl butyral resin with a plasticizer such as dioctophthalate or dibutyl phthalate. Other suitable polymers are polyvinyl formal, polyvinyl chloride, polyvinyl acetate or certain acrylic resins. The purposes of adding an easily evaporable solvent such as methanol is (i) to initially dissolve the binder so as to enable it to coat the individual glass particles, and (ii) to adjust the rheology of the slip or slurry for good castability.

One specific crystallizable glass which can be used for purposes of this invention has the following illustrative composition, by weight percent:

$SiO_2$—55.00
$Al_2O_3$—20.56
$MgO$—20.00.
$AlPO_4$—3.44
$B_2O_3$—1.00

This glass, on crystallization has a dielectric constant of about 5, and a thermal constant of expansion, Tce, of about $19 \times 10^{-7}/°$ C. in the temperature range of 20° to 90° C. or a Tce of $26 \times 10^{-7}/°$ C. at a temperature range of 20° to 300° C.

The thermal expansion of $19 \times 10^{-7}/°$ C. when metallized however with copper for conductors raises the value to $26 \times 10^{-7}/°$ C. which is a perfect match to silicon in the temperature range in which the substrates operated in the computer system.

This glass can be and is employed in fabricating the thin film stratum of the all-glass-ceramic package.

STEP 2

The slip or slurry prepared as in Step 1 is cast, in accordance with conventional techniques, into thin green sheets preferably by a doctor-blading technique.

STEP 3

The cast sheets are blanked to the required dimensions in a blanking tool and via holes are punched in them in the required configuration.

STEP 4

Metallizing paste of gold, silver or copper is extruded into the via holes in the individual sheets by screen printing method.

STEP 5

The required conductor patterns are screen printed on to the individual green sheets of Step 4.

STEP 6

A plurality of sheets prepared as in Step 5 are laminated together in registry in a laminating press.

The temperature and pressure employed for lamination should be such as to cause (i) the individual green sheets to bond to each other to yield a monolithic green substrate, (ii) to cause the green sheets to sufficiently flow and enclose the conductor patterns.

STEP 7

Firing the green sheet to the sintering temperature to accomplish binder removal, sintering of the glass particles and their concurrent conversion to glass-ceramics by crystallization, and the sintering of the metal particles in the thick film conductor patterns to dense metal lines and vias. The particular glass-ceramic composition chosen should be one that has an optimum sintering temperature between 50°–150° C. below the melting point of the conductor metal employed.

During the firing cycle, the organic binders begin to come off at 300° C. and the binder removal is essentially complete before appreciable glass-to-glass sintering has occurred. The sintering results in the conversion of glass to glass ceramic state in which the crystalline phases formed occupy greater than 80% of the body by volume. The holding time at the sintering temperature can vary from 1 to 5 hours. The body is then cooled at a controlled rate not to exceed 4° C./minute to at least about 400° C. after which faster cooling rates may be used.

When using copper as the metallizing paste, the firing of the substrate has to be done in non-oxidizing atmospheres and preferably in a hydrogen-water ambient as described in the aforesaid copending application of Herron et al. For this reason, organic binders employed for green sheet fabrication should be capable of being evaporated off in such atmospheres at reasonable temperatures.

Appropriate thin film metallization (e.g. excessive layers of chrome-copper-chrome, Cr-Cu-Cr) is then deposited in a blanket form on the glass-ceramic thick film substrate, and suitably personalized into extremely fine lines ($12\mu$ wide with $12\mu$ spaces) by either subetching, plating on of a thin layer of metal which is subsequently sputter etched, or other techniques into the desired pattern of metal lines on the preformed glass-ceramic base. Copper studs are then either plated or evaporated on the conductor lines. This is followed by applying a coating (e.g. about ½ mil to −2 mils) by spraying of a slurry of a powder of crystallizable glass (e.g. composition illustrated above) in a suspending medium such as terpineol, and heat treating it to sinter and crystalline in place. A second layer of the Cr-Cu-Cr metallization is then deposited on top of the formed glass-ceramic layer, with appropriate studs and next layer of glass-ceramic formed in the same way. The process may be repeated until the desired thin-film multilayer structure or superstructure is obtained. If thinner dielectric films (e.g. glass-ceramic) are desired for industrial purposes, they can be formed by evaporation of glass or glass-ceramic materials.

Two unique features of this technology are:
(1) Since the glass-ceramic, once formed is not only a substantially homogeneous glass-ceramic structure all the way from the base to the top but is capable of withstanding higher temperatures than required to form it originally, no viscous deformation is encountered during subsequent firing cycles to form additional overlays of the glass-ceramic. For example, the above illustrated crystallizable glass composition has a temperature of coalescence of about 780° C., at which it fuses together, and a temperature of crystallization of about 965° C. where it is converted to a glass-ceramic which glass-ceramic has a softening point of above 1100° C., which is about 300° C. above the coalescing temperature of the glass prior to crystallization. Thus the glass-ceramic formed is substantially unaffected by the formation of additional coatings of glass-ceramic. Also as will be noted, the coalescing and/or crystallization temperatures are substantially below the melting points of gold, silver and copper, e.g. 1061° C., 961° C. and 1081° C., respectively. With respect to silver, if crystallization of glass is desired to be effected below its melting point, other appropriate crystallizable glasses (having lower temperature of fusion and coalescence) can be employed, as for example, Glass Compositions 1 to 7 and 10 to 12 of the said copending application Ser. No. 875,703 of Kumar et al., as illustrated by the following:

$SiO_2$—52.5 wt.%
$MgO$—21.5 wt.%
$Al_2O_3$—21.0 wt.%
$P_2O_5$—2.0 wt.%, $B_2O_3$—1.0 wt.%

This also means that no bubbles will be formed and that metal lines will not distort.

(2) Since the surface finish of glass-ceramics is typically better than that of an alumina substrate base, the desired finer line metallization is possible with the glass-ceramic substrate base, as compared with alumina which does not allow 12 $\mu$m wide lines.

The composition of the crystallizable glass for both, the thick-film dielectric and the thin film dielectric, will, optionally be the same, with a dielectric constant of about 5 and a thermal expansion coefficient matching that of silicon after metallizing (e.g. $19 \times 10^{-7}/°$ C. at 20 to 90° C. and $26 \times 10^{-7}/°$ C. at 20° to 300° C.), and with sintering temperatures not exceeding 950° C. However, it is to be understood that if desired or where required, various combinations of the crystallizable glasses can be readily used.

BEST MODE FOR CARRYING OUT THE INVENTION

Figure 2:
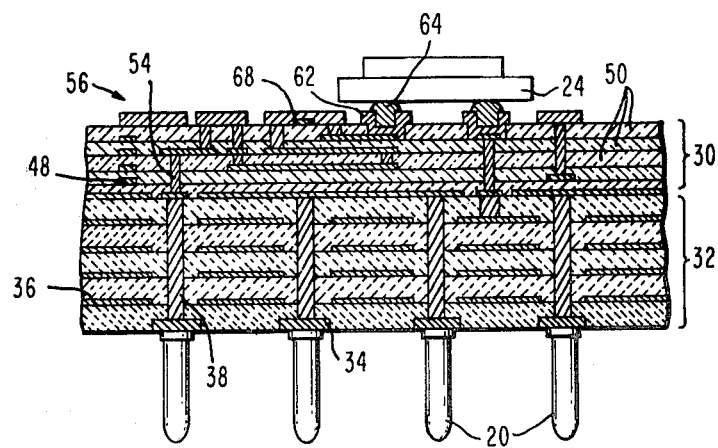
FIG. 2 is a partial cross-sectional view taken along lines 2—2, and more specifically illustrates the multilevels of interconnection for the package.
Figure 3:
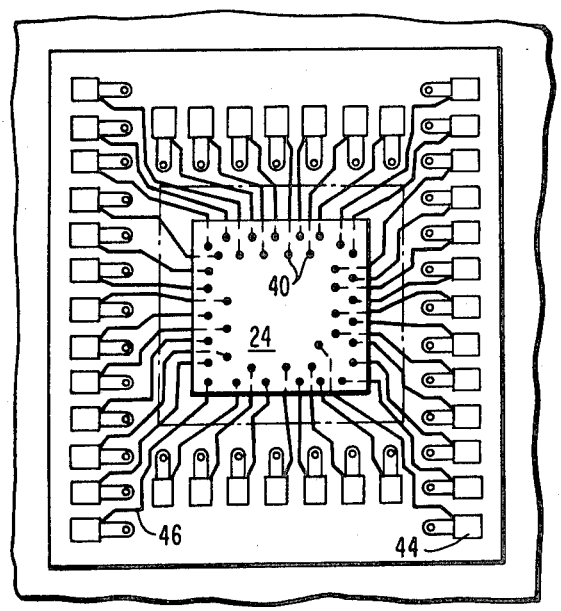
FIG. 3 is an enlarged plan view of a single chip site shown generally in FIG. 1, and illustrates the manner of interconnecting a particular chip to its upper surface metallurgy.

Now referring to FIGS. 1, 2 and 3, they illustrate the structural details of the complex interconnection structure necessary to communicate from the outside world via a plurality of pins 20 to a plurality of chip sites 22. A plurality of chips 24 populate each chip site 22. Components, such as capacitors 28, are readily mounted at the periphery of the package. The thick film interconnection metallurgy, shown more specifically in FIG. 2, also establishes voltage distribution planes, ground planes, X-Y signal planes, and voltage redistribution planes.

In this preferred embodiment, a glass-metal package 30 is joined to a pre-formed multi-layer glass-ceramic base 32. A plurality of pads 34 located on the under surface of the multi-layer ceramic base member 32 each connect to the pins 20. In the preferred embodiment, the pads 34 comprise a nickel plated tungsten metal, which are then joined to the pins 20 by brazing.

The multi-layer glass-ceramic base member 32 includes a multi-level thick film metallization generally indicated at 36 at a plurality of planes. Further vertical conductive paths through the multi-layer glass-ceramic base member 32 are provided by a plurality of metal-filled vias 38. The base member 32 electrically functions to provide voltage distribution planes. The number of voltage distribution planes are governed by the voltage requirements of the circuit logic family existing at the chip level.

Also, the base member 32 contains redistribution planes. Redistribution planes provide an interconnection translation which is necessary because the pins 20 communicating with the external world constitute a larger size grid than the grid existing at the semiconductor chip level, as represented by the plurality of pads schematically shown at 40 in FIG. 3. Also, FIG. 3 illustrates the ease with which interconnections are made from a plurality of pads 44, located on the upper surface of the glass-metal module 30, to the plurality of conductive lines 46. Lines 46 are formed by metal deposition steps, but upper surface connections can further be implemented by wire bonding, thermal compression bonding, etc.

The glass-ceramic/metal superstructure 30 comprises metallurgy generally shown at 48 located at multi-levels or planes separated by a plurality of insulating glass-ceramic layers 50. Vertical interconnections between different levels and the multi-layer glass-ceramic substrate 32 are provided by a plurality of studs 54.

In FIG. 2, the top level metallurgy is generally designated by numeral 56. Top level metallurgy 56 schematically corresponds to the pads and conductive lines shown in FIG. 3 as elements 44 and 46, respectively. The semiconductor chips 24 are joined to predetermined conductive paths by a metallurgical system and solder connection illustrated at 62 and 64, respectively.

In order to allow for engineering changes, the top level metallurgy 56 is provided with engineering change pads 68. Basically, the engineering change pads 68 comprise a material which is softer than the metallurgy 56 itself. Accordingly, severing pressure applied on the upper surface of the metallurgy 56 in the area of the pad 68 breaks the metal line. Re-routes or engineering changes are then available by making other connection, for example, wire bonding. Only one engineering change pad 68 is illustrated; however, in actual practice, numerous pads would be located throughout the upper layer metallurgy. Pads 68 may be formed of a material such as a polyimide polymer which would cushion any severing forces, thus preventing damage to the upper glass layer surface, but their existence is not absolutely required in all instances.

Figure 5:
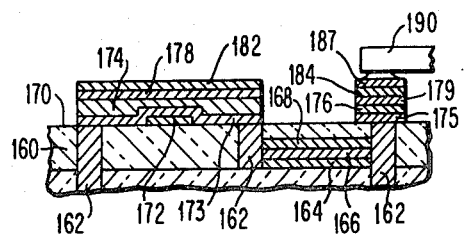
FIG. 5 is a cross-sectional view illustrating another embodiment of the upper or top level metallurgy.

As more specifically described with reference to FIG. 5, alternative techniques exist for customizing the upper layer metallization in order to readily affect deletions and engineering changes. FIG. 5 specifically illustrates a chromeless delete scheme, but simple mechanical or laser cutting approaches are equally suitable.

The resulting overall package is intended to operate in a suitable cooling environment as determined by the number of chips, electrical power requirements, and the heat transfer characteristics of the individual test sinks (not shown) joined to their respective chips 24.

In the preferred embodiment, the glass-ceramic metal module 30 contains an X and a Y signal plane, a redistribution plane, a voltage distribution plane, and a top level interconnection and engineering change plane.

In order to achieve maximum utilization and efficiency of a single planar surface, X and Y planes are employed. That is, in one orthogonal plane, substantially all of the metallurgy is deposited in one direction and in the other orthogonal plane, the metallurgy is deposited in a direction at right angles to that of its related plane.

Step 1

Figure 4A:
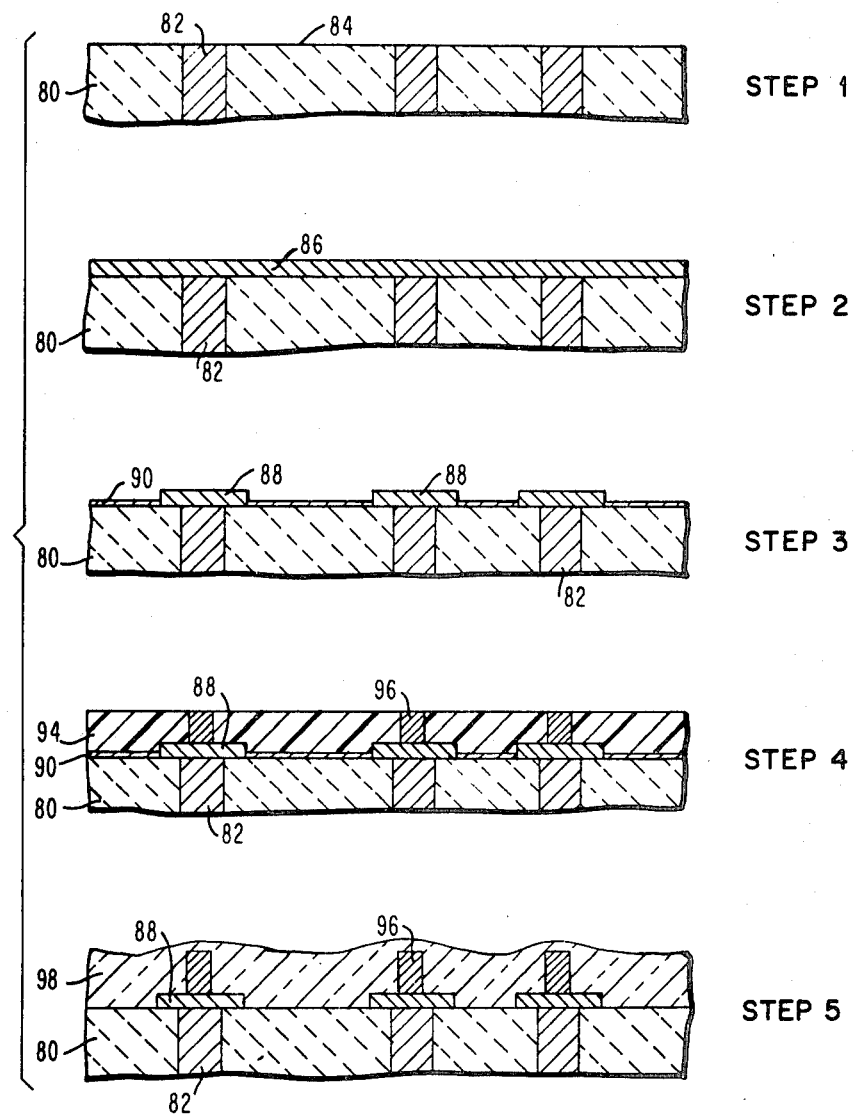
FIGS. 4A–4C are schematic step-by-step cross-sectional views illustrating a preferred embodiment for fabricating the glass-metal portion of the overall interconnection package.
Figure 4B:
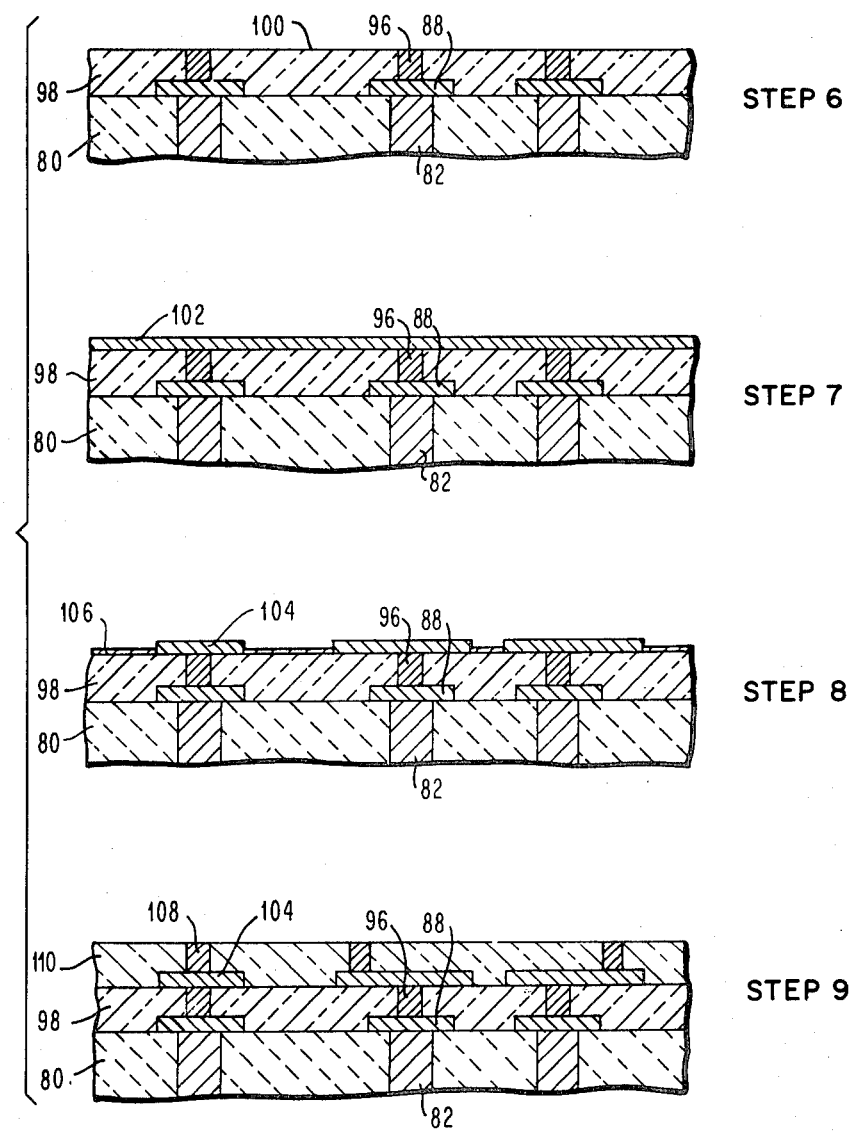
Figure 4C:
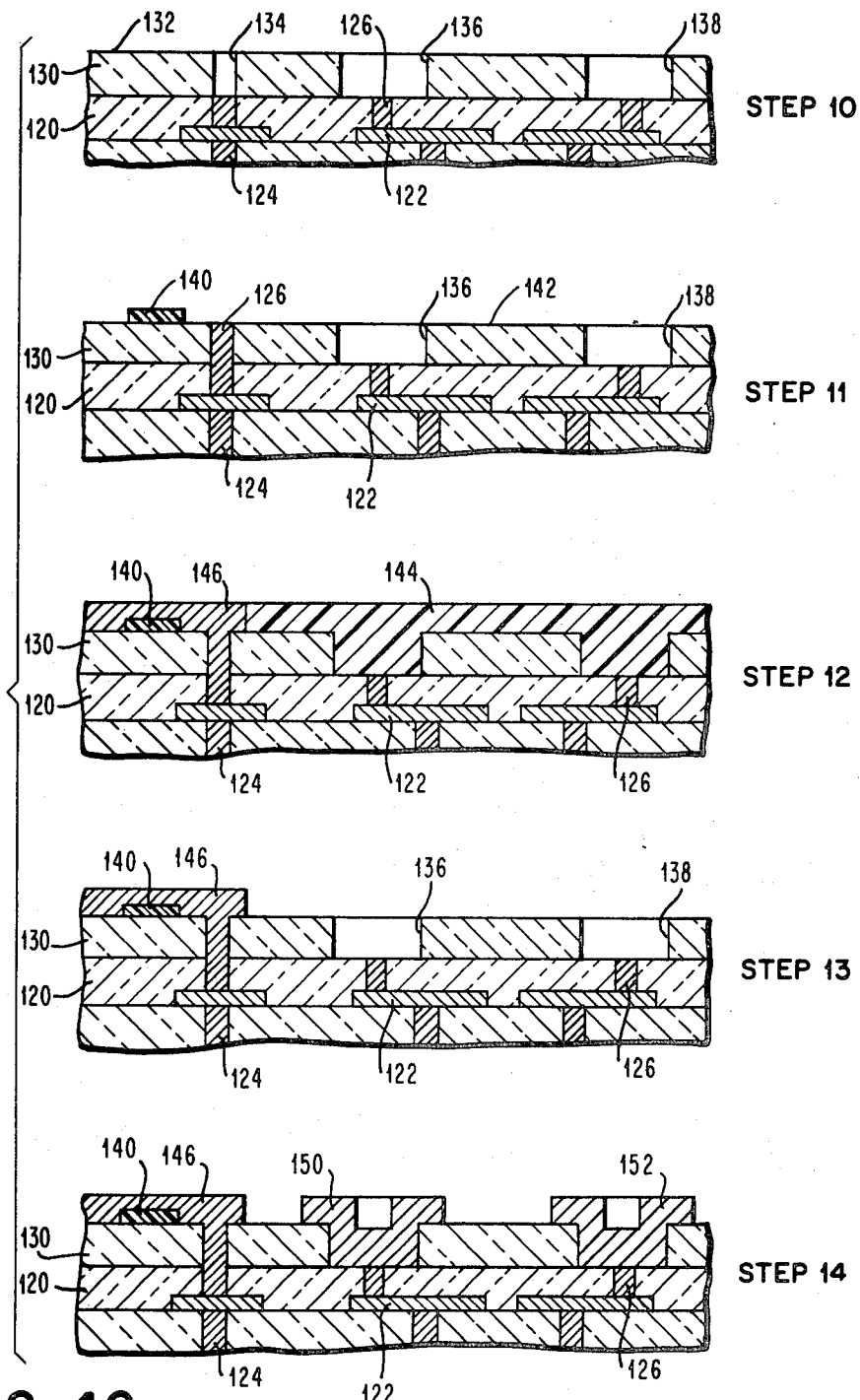

FIGS. 4A, 4B and 4C illustrate a preferred process embodiment for fabricating the glass metal module shown generally at 30 in FIGS. 1 and 2.

A pre-formed glass-ceramic body 80 having conductive vias 82 is lapped flat to a predetermined thickness. In the preferred embodiment, the overall thickness of the multi-level ceramic 30, FIGS. 1 and 2, is approximately 5 mils thick, ±3 mils. It is necessary to lap the upper surface 84 to a flatness or planarity within 0.1 to 0.2 mils. Lapping can be accomplished with a free or resin bonded abrasive pad and then the glass-ceramic body is cleaned.

It is essential that the subsequent glass deposition steps at the upper surface 84 be contaminant free. After the lapping operation, a 0.05 percent solution comprising non-ionic detergent in water is employed to scrub the upper surface 84. This step is followed by ultrasonic cleaning and rinsing steps using a cleaning agent, such as isopropanol. The selection of a non-ionic detergent is significant because it is not adsorbed by the ceramic surface, and it is readily removable because of its solubility in the isopropanol rinse.

In the preferred embodiment, the glass-ceramic substrate is a crystallizable glass, such as the above illustrated composition. However, other compositions having suitable thermal conductivity and dielectric properties and crystallizability can be employed.

Step 2

After conditioning the upper surface of the ceramic body 80, a blanket metallization layer 86 is deposited thereon. The deposition is accomplished by employing three separate sequential metal evaporations comprising chrome-copper-chrome. In the preferred embodiment, the metallization layer 86 comprises a lower chrome layer approximately 800Å thick, an overlying copper layer approximately 3μm thick, and a top chrome layer approximately 800Å thick.

The chrome metal is selected as a bottom layer because of its superior adhesion to glass-ceramic surfaces. The 3μm thick copper layer provides the primary electrical conductive path and its dimensions are mainly dictated by electrical design considerations. Again, the top 800Å thick layer of chrome is selected because of its good adhesion to the next layer of glass-ceramic.

Step 3

This illustrates the results of a selective etching operation. Suitable etchants are selected to provide a personalized metallization pattern comprising a plurality of lines 88. The selective etching operation leaves the metallization lines 88 comprising a chrome-copper-chrome metallurgical system, and only a thin chromium layer 90 in the etched away regions. This thin chromium layer 90 is employed in Step 4 as a cathode for an electroplating process used to deposit copper studs. Alternatively, the metal line resolution can be obtained by use of a lift-off resist E-beam blanket evaporation and a typical line pattern is of a 12μm width on a 12μm spacing between metal lines.

Step 4

In order to deposit a conductive stud in the desired locations, a photolithographic or photoresist sheet material 94 is applied over the conductive pattern 88 and the chromium layer 90. Conventional exposure and washing techniques provide openings in the desired locations. Then, using the chrome layer 90 as a cathode, copper studs 96 are plated in the selected openings. The thickness of the photoresist layer must be greater than the subsequent dielectric layer to assure that the studs can be plated high enough to connect to next level of metallurgy through the subsequent dielectric layer. After the electroplating operation, the photoresist material 94 and the chrome cathode layer 90 are removed in accordance with well-known techniques.

Step 5

After removing the photoresist layer 94 and the chrome cathode layer 90, a glass slurry is deposited on the glass-ceramic substrate 80 to form a layer 98 to a thickness well above the studs 96. The slurry can be deposited, for example, by doctor blading or spraying. The slurry is formed of a glass powder having an average particle size of 3-5 microns in a suspending medium, such as terpineol. In order to realize the desired physical and dielectric characteristics of the insulating glass-ceramic layer, it is important to form the glass slurry into a homogeneous and uniform dispersion.

The deposited glass slurry layer is dried at 125° C. for 15-20 minutes to drive off the suspending medium and then fired firstly in an inert gaseous ambient at 780° C. for 2 hours to sinter the glass and then further fired in the gaseous ambient, for example, nitrogen or argon, which is insoluble in the glass layer 98, for 2 hours at 965° C. to crystallize the glass into a glass-ceramic. It is also to be noted, that if oxidation is a problem (e.g. recopper conductors), crystallization of the glass can be effected in a $H_2O/H_2$ ambient.

Step 6

After layer 98 is cooled, it is necessary to condition the upper surface prior to subsequent steps. As illustrated in Step 6, the layer 98 is lapped to provide an upper planar surface 100. The lapping operation serves several functions. Firstly, it provides a (1) planar surface and (2) surface finish necessary for subsequent photolithographic steps. Further, it allows exact (3) thickness control of layer 98 and (4) exposes the studs.

Step 7

After conditioning layer 98 to form a suitable upper surface 100, three sequential metal evaporation steps are performed to deposit a blanket layer of metal 102, comprising chrome, copper, chrome. This step is identical with that previously described with respect to Step 2.

Step 8

This illustrates the selective personalization of the second level metallurgy identical to that as previously described in Step 3. The result of this operation leaves a selective metallization pattern indicated at 104 and a chromium cathode layer 106.

Step 9

Thereafter, the identical steps as described in Steps 4 through 6 are performed in order to deposit a second layer of interconnection comprising a second level metallized pattern 104 and second level studs 108, and a second level glass-ceramic insulation layer 110. After Step 9, the process is repeatable so as to provide any number of desired levels of the metallization.

It is to be re-emphasized that the novel method of the present invention allows successive layers of glass-ceramic and metal to be formed without disrupting the lower levels of metallization due to the fact that the firing temperature does not reflow the underlying glass-ceramic layers. Further, although the present process and resulting structure are fabricated at a firing temperature which normally would produce a bubbled-defective glass layer, the problem is avoided by virtue of the unique gaseous ambient firing step.

Now referring to FIG. 4C, it illustrates Steps 10 through 14 employed to fabricate the upper surface of the glass-ceramic/metal package.

Step 10

Step 10 illustrates the next-to-uppermost glass-ceramic layer 120 having a metallization pattern 122 connected to lower studs 124 and upper studs 126. Again, these elements are fabricated in accordance with the method previously described in Steps 1 through 9.

In addition, a glass type passivating material having properties different than the underlying glass layers is selected for the topmost glass layer 130. In the preferred embodiment, a solder reflow process is employed to join the semiconductor chips to their top level metallurgy. In Step 10, a glass type layer 130 comprising a high silicate-glass of thermal expansion matching the substrate material, or other suitable glass type material, inclusive of crystallizable glasses, is sputtered or otherwise deposited on the adjacent glass-ceramic layer 120. Conventional quartz sputtering techniques are used to deposit the uppermost layer 130. After the layer 130 is deposited, its upper surface 132 is conditioned to obtain the desired surface qualities and openings 134, 136 and 138 are formed.

Step 11

Next, a metallized vacuum deposition step is performed in order to extend the left hand upper stud 126 to the surface of the upper quartz layer 130. Also, an engineering change pad 140 is selectively deposited on the upper surface 142. The pad 140 serves as a cushion for subsequent engineering changes once the entire package is chip populated.

Steps 12 and 13

Thereafter, a conventional photoresist mask 144 is deposited on the upper quartz layer 130 in order to selectively expose desired metallization patterns. A metal deposition is then performed to form a selective metallized pattern, a portion of which is illustrated at 146. The resulting structure is illustrated in Step 13. Again, the metallurgy pattern 146 may comprise any suitable system, and in the preferred embodiment, it is constituted by a chrome-copper-chrome combination of metals.

Step 14

Step 14 illustrates the deposition step for providing a pair of chip lands 150 and 152. In the preferred embodiment, the chip lands 150 and 152 each comprise a chrome-copper-gold metallurgical system. Although not shown, well-known solder reflow techniques are then employed to join the chip pads to their respective chip land patterns as illustrated at 150 and 152. Chip bonding using the solder reflow process is illustrated in U.S. Pat. Nos. 3,374,110; 3,429,949; 3,495,133; all to Miller, and assigned to the same assignee as the present invention.

FIG. 5

FIG. 5 illustrates an alternative embodiment for the top level metallurgy previously depicted in Step 14 of FIG. 4B. The top layer of glass 160 contains a plurality of electroplated studs shown at 162. A metallization plane on the next-to-uppermost glass layer comprises chrome-copper-chrome layers 164, 166 and 168, respectively. In this embodiment, a chrome-less delete approach is employed on the uppermost metallization layer.

Firstly, a 1500 Å copper layer is blanket evaporated over the upper surface 170 of glass layer 160. Thereafter, an etching operation is performed in order to provide a plurality of islands of copper, one of which is illustrated at 172. Since copper does not adhere to glass as well as chromium, the metallization line is readily servable at this point using a sharp instrument whenever selective disconnection of circuit elements is desired.

Thereafter, a chrome layer followed by a copper layer is blanket deposited over the upper surface. Then, a selective etch operation defines the top surface metallization and chip lands. Chrome layer 173 and copper layer 174 represent metallization layers, and chrome layer 175 and copper layer 176 provide the two bottom-most metallization layers for the chip lands.

Next, a nickel electroplating operation using a photoresist mask and the chrome cathode (not shown, but previously discussed), deposits nickel layers 178 and 179.

Then, gold layers 182 and 184 are electroplated using the same mask as in the previous step. Then, the resist material and the chrome cathode (not shown) are removed.

Tin-lead layer 187 is sequentially evaporated through a metal mask in the chip pad sites only. Finally, a chip 190 having chip pads is positioned on the chip land sites and bonding is affected using well-known solder reflow techniques.

While the invention has been illustrated and described with respect to the preferred embodiments of the invention, it is to be understood that the invention is not limited to the precise construction herein disclosed, and the right is reserved to all changes and modifications coming within the scope of the invention as defined in the appended claims.

Having thus described the invention, what is claimed as new, and desired to be secured by Letters Patent is:

1. A method for fabricating a solid thermally compatible and integral glass-ceramic/metal electrical interconnection package adapted for bonding to semiconductor integrated circuit chips, comprising the steps of:
   (a) providing a glass-ceramic substrate having a plurality of metallized conductive planes interconnected together in a predetermined pattern,
   (b) forming a coating of a first metallized conductive pattern on the upper surface of said substrate in a predetermined pattern of interconnection to said planes,
   (c) forming a plurality of vertical conductive studs on said surface and coating in a predetermined pattern of interconnection to said conductive planes and coating,
   (d) forming a crystallizable glass layer on said surface having a temperature of crystallization below the melting point of said conductive coating and studs, wherein said substrate and said layer are selected from a glass-ceramic having either β-spodumene or cordierite as the principle crystalline phase,
   (e) heating said glass layer to the crystallization temperature thereof for sufficient time to crystallize said glass into a bubble-free glass-ceramic layer, said crystallization being effected without reflow of any underlying glass-ceramic layers or disruption of any lower levels of metallization and
   (f) conditioning said glass-ceramic layer to expose at the top surface thereof said vertical conductive studs.

2. The method of claim 1 wherein said conductive planes comprise thick film metallurgy and said conductive coating comprises thin film metallurgy.

3. The method of claim 2 including the steps of electrically connecting at least one of said chips to said studs.

4. The method of claim 1 including the steps of electrically connecting at least one of said chips to said studs.

5. A method for fabricating a solid all glass-ceramic/metal electrical interconnection package adapted for electrical connection to semiconductor integrated circuit chips, comprising the steps of:
(a) providing a glass-ceramic substrate having a plurality of metallized planes interconnected together in a predetermined pattern,
(b) forming a coating of a first metallized pattern on the upper surface of said substrate in a predetermined pattern of interconnection to said conductive planes,
(c) forming a plurality of conductive studs on said surface and coating in a predetermined pattern of interconnection to said conductive planes and coating,
(d) forming over said surface a crystallizable glass layer having a temperature of crystallization below the melting point of said conductive coating and studs, wherein said substrate and said layer are selected from glass-ceramics having either $\beta$-spodumene or cordierite as the principle crystalline phase,
(e) heating said glass layer to the crystallization temperature thereof for sufficient time to crystallize said glass layer into a bubble-free glass-ceramic layer, said crystallization being effected without reflow of any underlying glass-ceramic layers or disruption of any lower levels of metallization,
(f) conditioning said glass-ceramic layer to expose at the top surface thereof said studs,
(g) forming on the exposed surface of the glass-ceramic layer an additional coating of a metallized pattern in a predetermined pattern of interconnection to underlying conductive planes, patterns and studs,
(h) forming a plurality of additional conductive studs on the said exposed glass-ceramic surface in a predetermined pattern of interconnection to underlying conductive planes, pattern and studs,
(i) forming over the underlying glass-ceramic layer an additional layer of said crystallizable glass having a temperature of crystallization below the melting point of the underlying conductive coatings and studs,
(j) heating said additional layer of glass to the crystallization temperature thereof for sufficient time to crystallize the glass layer into an additional bubble-free glass-ceramic layer, said crystallization being effected without reflow of any underlying glass-ceramic layers or disruption of any lower levels of metallization, and
(k) conditioning said additional glass-ceramic layer to expose at the top surface thereof the immediate underlying studs.

6. The method of claim 5 wherein said conductive planes comprise thick film metallurgy and said conductive coatings comprise thin film metallurgy.

7. The method of claim 6 including the steps of electrically connecting at least one of said chips to said studs.

8. The method of claim 5 including repeating Steps g to k thereof to obtain a desired number of levels of said conductive patterns.

9. The method of claim 8 wherein said conductive planes comprise thick film metallurgy and said conductive coatings comprise thin film metallurgy.

10. The method of claim 8 including the steps of electrically connecting at least one of said chips to said studs.

11. The method of claim 5 including the steps of electrically connecting at least one of said chips to said studs.

12. The method of claim 1, 2, 3, 4, 5, 6, 7, 8, 9, 10 or 11 wherein said conductive planes and coating is selected from copper, gold or silver based metallurgy.

13. The method of claims 1, 2, 3, 4, 5, 6, 7, 8, 9, 10 or 11 wherein said conductive planes and coating comprise copper based metallurgy.

* * * * *